(12) United States Patent
Lu et al.

(10) Patent No.: US 6,459,317 B1
(45) Date of Patent: Oct. 1, 2002

(54) SENSE AMPLIFIER FLIP-FLOP

(75) Inventors: Kan Lu, Aliso Viejo, CA (US);
Chongjun June Jiang, Aliso Viejo, CA (US); Uming U. Ko, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/733,250

(22) Filed: Dec. 8, 2000

(Under 37 CFR 1.47)

Related U.S. Application Data

(60) Provisional application No. 60/171,761, filed on Dec. 22, 1999.

(51) Int. Cl.[7] ............................................... H03K 3/037
(52) U.S. Cl. ........................................ 327/217; 327/218
(58) Field of Search ............................ 327/213, 51, 52, 327/55, 217; 365/207, 208, 205

(56) References Cited

U.S. PATENT DOCUMENTS 4,149,099 A * 4/1979 Nagami ..................... 327/213
4,845,675 A * 7/1989 Krenik et al. ............... 365/203

* cited by examiner

*Primary Examiner*—My-Trang Nuton
*Assistant Examiner*—Hiep Nguyen
(74) *Attorney, Agent, or Firm*—Robert D. Marshall, Jr.; W. James Brady, III; Frederick J. Telecky, Jr.

(57) ABSTRACT

A flip-flop (14) is disclosed that includes an input circuit (50), a sense amplifier (52) and an output circuit (56). The input circuit (50) is operable to receive a data input signal and to generate complementary data signals. The sense amplifier (52) is coupled to the input circuit (50). The sense amplifier (52) is operable to receive the data signals from the input circuit (50) and to generate complementary amplified signals based on the data signals. The output circuit (56) is coupled to the sense amplifier (52). The output circuit (56) is operable to receive the amplified signals from the sense amplifier (52) and to generate complementary output signals based on the amplified signals.

9 Claims, 2 Drawing Sheets

SENSE AMPLIFIER FLIP-FLOP

This appl. claims priority of provisional appl. No. 60/171,761, filed Dec. 22, 1999.

TECHNICAL FIELD OF THE INVENTION

This invention relates generally to digital signal processing and more particularly to a sense amplifier flip-flop.

BACKGROUND OF THE INVENTION

In the art of digital signal processing, flip-flops are frequently used. For example, a series of flip-flops are often connected together in a chain to form a shift register, which is a basic component used in a wide variety of applications. Typical flip-flops provide one of four types of data interfaces from input to output: static-to-static, static-to-dynamic, dynamic-to-static, or dynamic-to-dynamic. Thus, each flip-flop generally receives only static data input or dynamic data input and generates only static data output or dynamic data output.

Sense amplifiers are commonly used along with flip-flops in many different applications, such as random access memories (RAMs). The sense amplifiers are generally implemented as part of the memory design, while flip-flops are generally implemented as part of the logic design for a particular application.

In a typical RAM, the set-up time for a flip-flop can be a limiting factor in the speed of the RAM. This set-up time includes a delay within the flip-flop itself, as well as a delay introduced by the sense amplifier. A typical application using sense amplifiers in conjunction with flip-flops, such as a RAM, thus suffers from several disadvantages. These include the single type of data interface provided by the flip-flop and the speed-limiting set-up time.

SUMMARY OF THE INVENTION

In accordance with the present invention, a sense amplifier flip-flop is provided that substantially eliminates or reduces disadvantages and problems associated with previously developed flip-flops. In particular, a flip-flop is disclosed that provides universal interfacing and reduced set-up time.

In one embodiment of the present invention, a flip-flop is provided that includes an input circuit, a sense amplifier and an output circuit. The input circuit is operable to receive a data input signal and to generate complementary data signals. The sense amplifier is coupled to the input circuit. The sense amplifier is operable to receive the data signals from the input circuit and to generate complementary amplified signals based on the data signals. The output circuit is coupled to the sense amplifier. The output circuit is operable to receive the amplified signals from the sense amplifier and to generate complementary output signals based on the amplified signals.

Technical advantages of the present invention include providing an improved flip-flop. In particular, a single flip-flop is designed to provide both static and dynamic outputs. As a result, universal interfacing is provided by a single flip-flop. Accordingly, flip-flops of differing designs are not required for different types of interfacing.

Additional technical advantages of the present invention include providing a sense amplifier as part of the logic design within the flip-flop. As a result, the set-up time for the flip-flop is reduced. Accordingly, the performance speed of the flip-flop is increased. In addition, a random access memory incorporating the improved flip-flop is likewise improved.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

Figure 1:
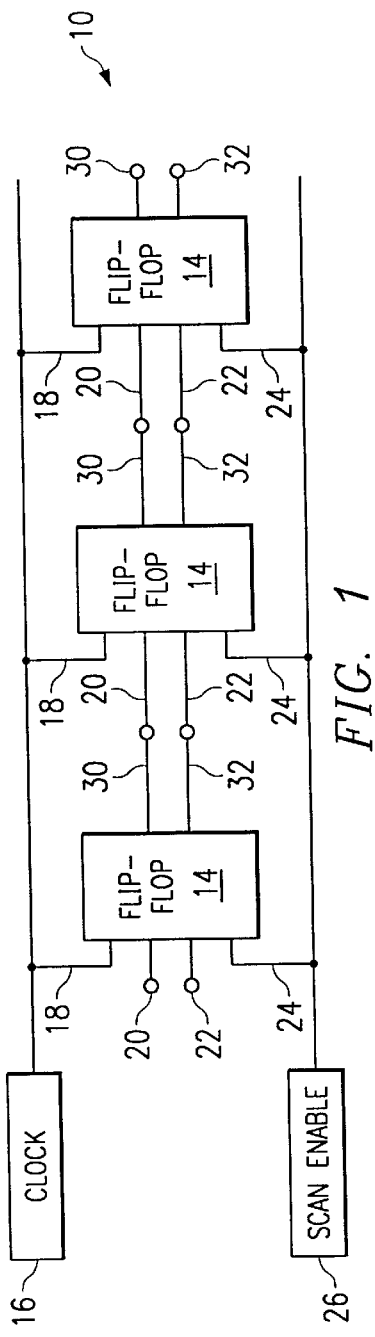
FIG. 1 is a block diagram illustrating a shift register including a plurality of flip-flops constructed in accordance with one embodiment of the present invention.

FIG. 1 is a block diagram illustrating a shift register 10 including a plurality of flip-flops 14 constructed in accordance with one embodiment of the present invention. Each flip-flop 14 may comprise a clock signal input line 18 for receiving a clock signal from a clock 16, a data input line 20 for receiving data, a scan input line 22 for receiving test data, a scan enable input line 24 for receiving an enable signal from a scan enable 26, an output line 30 for producing an output signal, and a scan output line 32 for producing a scan output signal. The clock 16 generates a clock signal to synchronize the flip-flops 14.

The shift register 10 has two modes of operation: a scan mode for testing and a data mode for normal operation. In the scan mode, the shift register 10 receives a predetermined scan input signal at the scan input line 22 for the first flip-flop 14 in the shift register 10. This signal may be, for example, an alternating high/low signal with a period that is a multiple of the clock signal provided by the clock 16. The output of the final flip-flop 14 of the shift register 10 is then analyzed to ensure that the scan input signal was properly passed through the shift register 10. In the data mode, an actual data signal is received on the data input line 20 and processed by the shift register 10.

In accordance with one embodiment of the present invention, the scan input signal received by each flip-flop 14 while in the scan mode may be received at either the data input line 20 or the scan input line 22. In addition, the output generated by each flip-flop 14 while in the scan mode maybe provided at either the output line 30 or the scan output line 32. For the embodiment in which the scan input is received at the data input line 20, no scan input line 22 is needed. Instead, the scan input, as well as the output from the previous flip-flop, is provided to the data input line 20. Similarly, in accordance with another embodiment of the present invention, scan output maybe provided at the output line 30 for each flip-flop 14 instead of at a separate scan output line 32. Thus, the output line 30 may provide data to both the data input line 20 and the scan input line 22 for the subsequent flip-flop 14. Any combination of these embodiments may be utilized in accordance with the requirements of a particular application. Therefore, each flip-flop 14 may include either only a data input line 20 or a data input line 20 and a scan input line 22 and may also include either only an output line 30 or an output line 30 and a scan output line 32.

Figure 2:
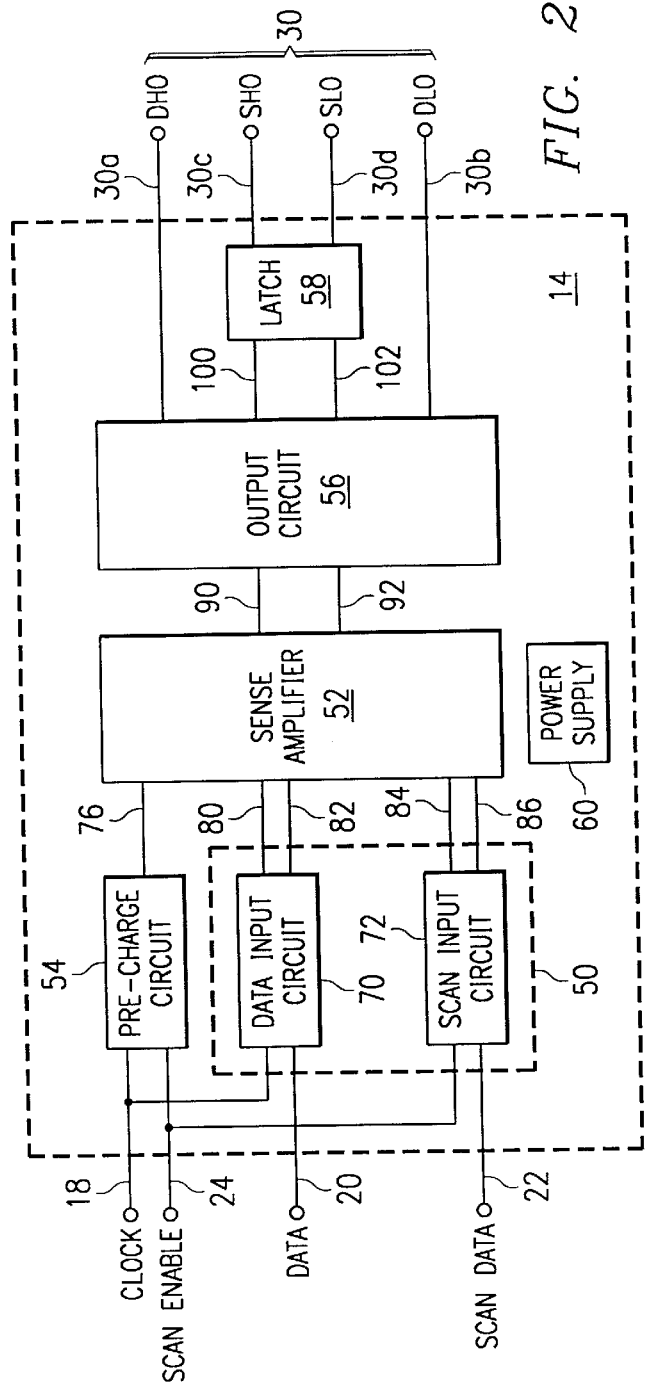
FIG. 2 is a block diagram illustrating the flip-flop of FIG. 1 in greater detail in accordance with one embodiment of the present invention.

FIG. 2 is a block diagram illustrating a flip-flop 14 in greater detail in accordance with one embodiment of the present invention. The flip-flop 14 comprises an input circuit 50 for processing input signals, a sense amplifier 52 for amplifying signals, a pre-charge circuit 54 for pre-charging specified nodes of the flip-flop 14, an output circuit 56 for generating output signals, a latch 58 for generating additional output signals, and a power supply 60 for providing power to the other components of the flip-flop 14.

The input circuit 50 comprises a data input circuit 70 for processing data input signals and a scan input circuit 72 for processing scan input signals. The data input circuit 70 receives a clock signal from line 18 and a data signal from line 20. The data input circuit 70 then generates complementary data signals which are provided to the sense amplifier 52 on lines 80 and 82. The scan input circuit 72 receives a scan enable signal from line 24 and a scan input signal from line 22 and generates complementary scan signals which are provided to the sense amplifier 52 on lines 84 and 86.

The pre-charge circuit 54 receives a clock signal from line 18 and a scan enable signal from line 24. The pre-charge circuit 54 pre-charges specified nodes, as described in more detail below in connection with FIG. 3. The sense amplifier 52 receives a signal from the pre-charge circuit 54 on line 76 which corresponds to the specified nodes that are pre-charged by the pre-charge circuit 54. It will be understood that line 76 may comprise a plurality of lines and that the sense amplifier 52 may receive a plurality of signals from the pre-charge circuit 54. The sense amplifier 52 processes the signals received on lines 76, 80, 82, 84 and/or 86 and generates complementary amplified signals that are provided to the output circuit 56 on lines 90 and 92.

The output circuit 56 generates complementary dynamic output signals on lines 30a and 30b based on the amplified signals received on lines 90 and 92 from the sense amplifier 52. Thus, for example, line 30a may provide a dynamic high output, while line 30b provides a dynamic low output. The output circuit 56 also generates complementary secondary output signals based on the amplified signals received on lines 90 and 92 from the sense amplifier 52. These secondary output signals are provided to the latch 58 on lines 100 and 102. The latch 58 generates complementary static output signals based on the secondary output signals received on lines 100 and 102 from the output circuit 56. The latch 58 provides the static output signals on lines 30c and 30d. Thus, for example, a static high output may be provided on line 30c, while a static low output may be provided on line 30d.

Therefore, the flip-flop 14 may provide up to four different outputs: two dynamic outputs and two static outputs. As a result, universal interfacing is provided by a single flip-flop 14 that is capable of providing static-to-static, static-to-dynamic, dynamic-to-static, and dynamic-to-dynamic interfacing. Additionally, because the sense amplifier 52 is implemented within the logic design of the flip-flop 14, as opposed to being part of a memory design, the set-up time associated with the flip-flop 14 is substantially reduced which increases the performance speed of the flip-flop 14.

In operation while in the scan mode, the scan enable signal on line 24 is high, the clock signal on line 18 and the data on line 20 are irrelevant, and the scan data on line 22 determines the output on lines 30. In the data mode, the scan enable signal on line 24 is low, the scan data on line 22 is irrelevant, and the clock signal on line 18 and the data on line 20 determine the output on lines 30.

As described in more detail below, in the data mode, the dynamic outputs 30a–b are low and the static outputs 30c–d are latched to their previous values while the clock signal on line 18 is low. Additionally, in the data mode with the clock signal on line 18 low, the pre-charge circuit 54 pre-charges specified nodes to a high value. When the clock signal goes high, however, the outputs 30 may change based on the data on line 20. If data on line 20 is low when the clock signal goes high, the dynamic high output 30a and the static low output 30d are low, while the dynamic low output 30b and the static high output 30c are high. Similarly, if the data on line 20 is high when the clock signal goes high, the dynamic high output 30a and the static low output 30d are high, while the dynamic low output 30b and the static high output 30c are low.

The information just described is summarized in the table below, with 1 indicating high, 0 indicating low, L indicating latched, and X indicating irrelevant data:

| Mode | Scan Enable (24) | Scan Data (22) | Clock (18) | Data (20) | Outputs (30) |
| --- | --- | --- | --- | --- | --- |
| Scan | 1 | 1 or 0 | X | X | Determined by Scan Data (22) |
| Data | 0 | X | 0 | X | 30a,b = 0<br>30c,d = L |
| Data | 0 | X | 1 | 1 | 30a,d = 1<br>30b,c = 0 |
| Data | 0 | X | 1 | 0 | 30a,d = 0<br>30b,c = 1 |

Figure 3:
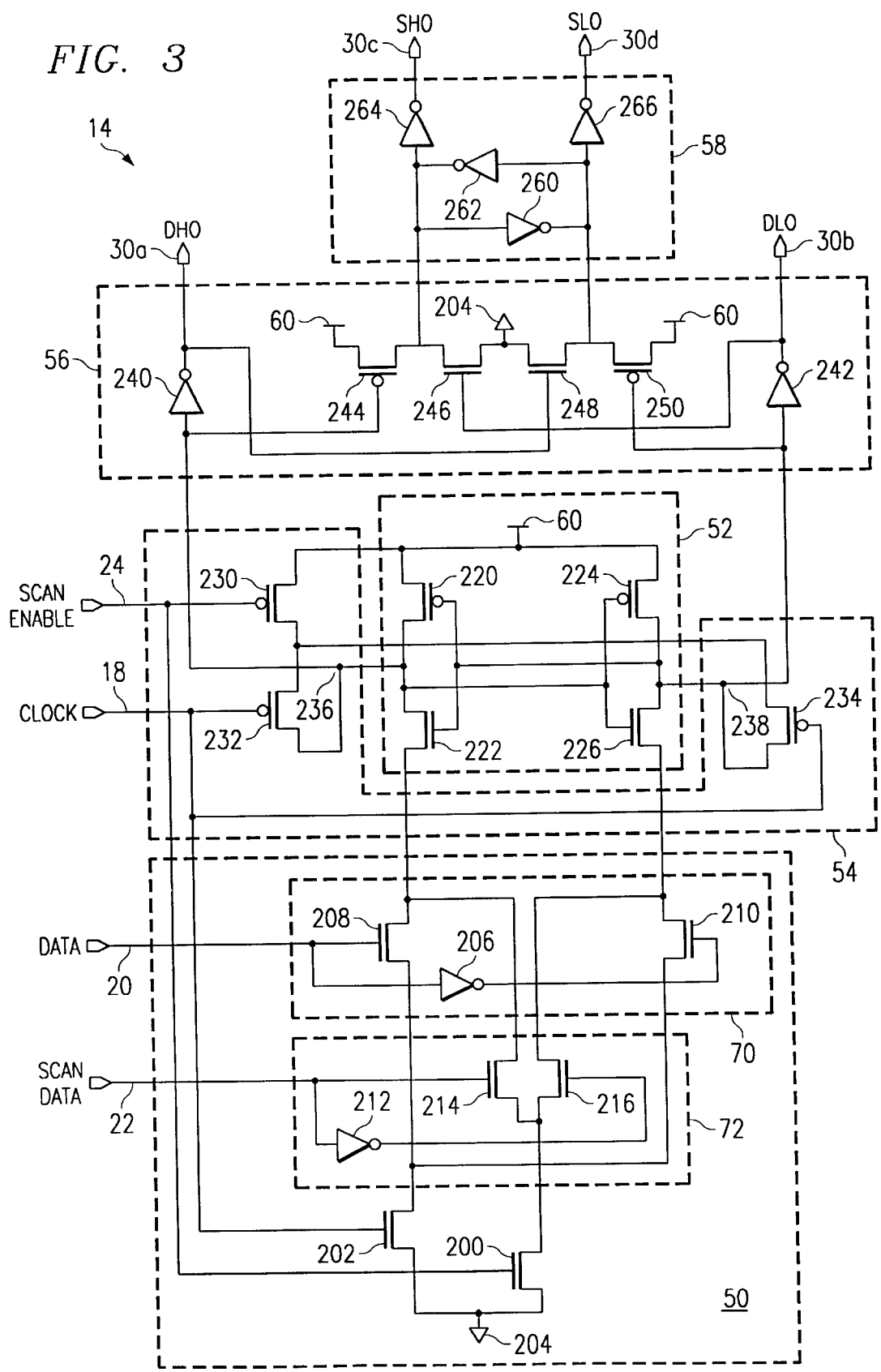
FIG. 3 is a schematic diagram of the flip-flop of FIG. 2 in accordance with one embodiment of the present invention.

FIG. 3 is a schematic diagram of the flip-flop 14 in accordance with one embodiment of the present invention. The input circuit 50 comprises two switches 200 and 202 and a coupling to ground 204, in addition to the data input circuit 70 and the scan input circuit 72. Switches 200 and 202, in addition to the other switches illustrated in FIG. 3, may comprise field effect transistors as shown or any other suitable switching devices. The data input circuit 70 comprises an inverter 206 and two switches 208 and 210. The scan input circuit 72 also comprises an inverter 212 and two switches 214 and 216.

The sense amplifier 52 comprises four switches 220, 222, 224 and 226 and a coupling to the power supply 60. The pre-charge circuit 54 comprises three switches 230, 232 and 234 for pre-charging two nodes 236 and 238. The output circuit 56 comprises two inverters 240 and 242 and four switches 244, 246, 248 and 250, as well as couplings to the power supply 60 and to ground 204. The latch 58 comprises four inverters 260, 262, 264 and 266.

In operation, when the flip-flop 14 is in the data mode, line 24 is low which closes switch 230. While the clock signal on line 18 is also low, switches 232 and 234 are also closed. Thus, the pre-charge circuit 54 passes the high value from the power supply 60 through switches 230 and 232 to node 236, pre-charging that node 236 to high. Additionally, the pre-charge circuit 54 passes the high value from the power supply 60 through switches 230 and 234 to node 238, pre-charging that node 238 to high.

When the clock signal on line 18 goes high, switch 202 switches from opened to closed, allowing the signal from ground 204 to pass to switches 208 and 210 of the input circuit 70. Data on line 20 is provided to switch 208 and is inverted by inverter 206 before being provided to switch 210. Thus, one of these switches 208 or 210 will be closed by the data on line 20, while the other switch 210 or 208 is opened by the same data.

For data that is high on line 20, switch 208 is closed and switch 210 is opened. Switch 222 is closed by the signal from the pre-charged node 238 in the pre-charge circuit 54, while switch 220 is opened by the same signal. Thus, the ground signal from switch 202 is passed through switch 208 to the sense amplifier 52 by way of switch 222. This pulls node 236 low. Node 236 provides this low signal to inverter 240 and switch 244 of the output circuit 56. Inverter 240 inverts the low signal from node 236 to produce a high signal. Thus, the dynamic high output generated at line 30a is high. In addition, the low signal from node 236 closes switch 244, while the high output from inverter 240 closes switch 248.

Returning to the sense amplifier 52, the low signal at node 236 is provided to switches 224 and 226, closing switch 224 and opening switch 226. Thus, the high signal from the power supply 60 continues to be provided at node 238. This high signal is passed to inverter 242 and switch 250 of the output circuit 56. Inverter 242 inverts the high signal from node 238 to produce a low signal. Inverter 242 provides the low signal to switch 246 which opens that switch 246. Switch 250 is also opened due to the high signal from node 238.

Therefore, switches 244 and 248 are closed, while switches 246 and 250 are opened. This allows the high signal from the power supply to be provided by switch 244 to inverter 264 of the latch 58. Additionally, the low signal from ground 204 is provided by switch 248 to inverter 266 of the latch 58. Thus, the static high output on line 30c is low, while the static low output on line 30d is high. When the clock signal on line 18 eventually goes low again, inverters 260 and 262 allow the latch 58 to latch the previous signals such that the static outputs on lines 30c–d are maintained until the clock goes high again.

Similarly, if the data provided on line 20 is low, switch 210 is closed and switch 208 is opened. The same process then functions in reverse to provide opposite outputs on lines 30. Additionally, while in the scan mode, a similar process also provides the outputs on lines 30. However, inverter 212 and switches 214 and 216 of the scan input circuit 72 are utilized in conjunction with switch 200, as opposed to inverter 206 and switches 208 and 210 of the input circuit 70 being utilized in conjunction with switch 202.

Although the present invention has been described with several embodiments, various changes and modifications may be suggested to one skilled in the art. It is intended that the present invention encompass such changes and modifications as fall within the scope of the appended claims.

What is claimed is:

1. A flip-flop, comprising:
   an input circuit operable to receive a data input signal and to generate complementary data signals;
   a sense amplifier coupled to the input circuit, the sense amplifier operable to receive the data signals from the input circuit and to generate complementary amplified signals based on the data signals;
   an output circuit coupled to the sense amplifier, the output circuit and to receive the amplified signals from the sense amplifier and to generate complementary output signals based on the amplified signals;
   a latch coupled to the output circuit, the latch operable to receive the output signals from the output circuit, to generate complementary static output signals based on the output signals and to maintain the static output signals.

2. The flip-flop of claim 1, further comprising:
   a clock input operable to provide a clock signal to the input circuit; and
   the latch operable to generate the static output signals when the clock signal comprises a first logic level and to maintain the static output signals when the clock signal comprises a second logic level.

3. A method for providing a universal interface with a flip-flop, comprising:
   receiving at an input circuit a data input signal;
   generating with the input circuit complementary data signals;
   coupling a sense amplifier to the input circuit;
   receiving at the sense amplifier the data signals from the input circuit;
   generating with the sense amplifier complementary amplified signals based on the data signals;
   coupling an output circuit to the sense amplifier;
   receiving at the output circuit the amplified signals from the sense amplifier; and
   generating with the output circuit complementary output signals based on the amplified signals, the complementary output signals generated by the output circuit comprising complementary secondary output signals, the method further comprising:
   coupling a latch to the output circuit;
   receiving at the latch the secondary output signals from the output circuit;
   generating with the latch complementary static output signals based on the secondary output signals; and
   maintaining with the latch the static output signals.

4. The method of claim 3, further comprising:
   providing a clock signal to the input circuit;
   generating with the latch the static output signals when the clock signal comprises a first logic level; and
   maintaining with the latch the static output signals when the clock signal comprises a second logic level.

5. A flip-flop, comprising:
   an input circuit operable to receive a data input signal and to generate complementary data signals;
   a scan input circuit operable to receive a scan input signal and to generate complementary scan signals;
   a scan enable input operable to provide a scan enable signal to the scan input circuit;
   a sense amplifier coupled to the input circuit and to the scan input circuit, the sense amplifier operable to receive the data signals from the input circuit and the scan signals from the scan input circuit and to generate complementary amplified signals based on a selected one of the data signals and the scan signals dependent upon the state of said scan enable signal; and
   an output circuit coupled to the sense amplifier, the output circuit operable to receive the amplified signals from the sense amplifier, to generate a scan output signal when the scan enable signal comprises a first logic level and to generate complementary output signals based on the amplified signals when the scan enable signal comprises a second logic level.

6. A flip-flop, comprising:
   an input circuit operable to receive a data input signal and to generate complementary data signals;
   a scan input circuit operable to receive a scan input signal and to generate complementary scan signals;
   a scan enable input operable to provide a scan enable signal to the scan input circuit;

a sense amplifier coupled to the input circuit and to the scan input circuit, the sense amplifier operable to receive the data signals from the input circuit and the scan signals from the scan input circuit and to generate complementary amplified signals based on the data signals and based on the scan signals; and an output circuit coupled to the sense amplifier, the output circuit operable to receive the amplified signals from the sense amplifier, to generate a scan output signal when the scan enable signal comprises a first logic level and to generate complementary output signals based on the amplified signals when the scan enable signal comprises a second logic level;

a clock input operable to provide a clock signal to the input circuit;

a latch coupled to the output circuit, the latch operable to receive the output signals from the output circuit, to generate complementary static output signals based on the output signals and to maintain the static output signals; and the latch further operable to generate the static output signals when the clock signal comprises a first logic level and to maintain the static output signals when the clock signal comprises a second logic level.

7. A flip-flop, comprising:

an input circuit to receive an data input signal and a clock signal, said input circuit including
  a first input circuit transistor of a first conductivity type having a gate receiving said clock signal and a source-drain path connected between a first input circuit node and a ground voltage,
  a second input circuit transistor of said first conductivity type having a gate receiving said data input signal and a source-drain path connected between a second input circuit node and said first input circuit node,
  an input circuit inverter having an input receiving said data input signal and an output, and
  a third input circuit transistor of said first conductivity type having a gate connected to said output of said input circuit inverter and a source-drain path connected between a third input circuit node and said first input circuit node;

a sense amplifier coupled to said input circuit including
  a first sense amplifier transistor of said first conductivity type having a gate and a source-drain path connected between a first sense amplifier node and said first input circuit node,
  a second sense amplifier transistor of a second conductivity type opposite to said first conductivity type having a gate connected to said gate of said first sense amplifier transistor and a source-drain path connected between a supply voltage and said first sense amplifier node,
  a third sense amplifier transistor of said first conductivity type having a gate connected to said first sense amplifier node and a source-drain path connected between a second sense amplifier node and said second input circuit node,
  a fourth sense amplifier transistor of said second conductivity type having a gate connected to said gate of said third sense amplifier transistor and a source-drain path connected between said supply voltage and said second sense amplifier node,
  wherein said gates of said first and second sense amplifier transistors are connected to connected to said second sense amplifier node,
  a first precharge transistor of said second conductivity type having a gate receiving said clock signal and a source-drain path connected between a voltage source and said first sense amplifier node, and
  a second precharge transistor of said second conductivity type having a gate receiving said clock signal and a source-drain path connected between said voltage source and said second sense amplifier node; and an output circuit connected to said sense amplifier, said output circuit including
  a first output circuit inverter having an input connected to said first sense amplifier node and an output forming a first output of said flip-flop circuit, and
  a second output circuit inverter having an input connected to said second sense amplifier node and an output forming a second output of said flip-flop circuit.

8. The flip-flop circuit of claim 7, further comprising:

a scan input circuit to receive an scan input signal, said scan input circuit including
  a first scan input circuit transistor of said first conductivity type having a gate receiving a scan enable signal and a source-drain path connected between a first scan input circuit node and a ground voltage,
  a second scan input circuit transistor of said first conductivity type having a gate receiving said scan input signal and a source-drain path connected between said second input circuit node and said first scan input circuit node,
  a scan input circuit inverter having an input receiving said scan input signal and an output, and
  a third scan input circuit transistor of said first conductivity type having a gate connected to said output of said scan input circuit inverter and a source-drain path connected between said third input circuit node and said first scan input circuit node; and said sense amplifier wherein said voltage source includes a third precharge transistor of said second conductivity type having a gate receiving said scan enable signal and a source-drain path having a first terminal connected between said supply voltage and a second terminal serving as said voltage source.

9. The flip-flop of claim 7, wherein:

said output,circuit further includes
  a first output circuit transistor of said second conductivity type having a gate connected to said first sense amplifier node and a source-drain path connected between said supply voltage and a first output circuit node,
  a second output circuit transistor of said first conductivity type having a gate connected to said output of said second output circuit inverter and a source-drain path connected between said first output circuit node and ground,
  a third output circuit transistor of said second conductivity type having a gate connected to said second sense amplifier node and a source-drain path connected between said supply voltage and a second output circuit node,
  a fourth output circuit transistor of said first conductivity type having a gate connected to said output of said first output circuit inverter and a source-drain path connected between said second output circuit node and ground, a third output circuit inverter having an input connected to said first output circuit node and an output serving as a first static output of said flip-flop, a fourth output circuit inverter having an input connected to said second output circuit node and an output serving as a second static output of said flip-flop, a fifth output circuit inverter having an input connected to said first output circuit node and an output connected to said second output circuit node, and a sixth output circuit inverter having an input connected to said second output circuit node and an output connected to said first output circuit node.

* * * * *